(12) United States Patent
Malik et al.

(10) Patent No.: US 7,449,888 B1
(45) Date of Patent: Nov. 11, 2008

(54) METHOD AND APPARATUS FOR MULTI-DIMENSIONAL PARALLEL MR IMAGING

(75) Inventors: Nabeel M. Malik, Missouri City, TX (US); Eddy B. Boskamp, Menomonee Falls, WI (US); John E. Lorbiecki, Hubertus, WI (US); Scott A. Lindsay, Dousman, WI (US)

(73) Assignees: General Electric Company, Schenectady, NY (US); The Texas A&M University System, A Texas State Agency, College Station, TX (US)

( * ) Notice: Subject to any disclaimer, the term of this patent is extended or adjusted under 35 U.S.C. 154(b) by 15 days.

(21) Appl. No.: 11/161,233

(22) Filed: Jul. 27, 2005

(51) Int. Cl.
*G01V 3/00* (2006.01)
(52) U.S. Cl. ..................................... 324/318
(58) Field of Classification Search ......... 324/300–322; 600/410–435; 333/219–235; 343/725, 872, 343/876, 878, 879–893
See application file for complete search history.

(56) References Cited

U.S. PATENT DOCUMENTS

| | | | | | |
|---|---|---|---|---|---|
| 5,430,378 | A | * | 7/1995 | Jones | 324/318 |
| 5,682,098 | A | * | 10/1997 | Vij | 324/318 |
| 6,313,633 | B1 | * | 11/2001 | Boskamp | 324/319 |
| 6,433,548 | B1 | * | 8/2002 | Furuta et al. | 324/318 |
| 6,577,888 | B1 | * | 6/2003 | Chan et al. | 600/422 |
| 6,650,926 | B1 | * | 11/2003 | Chan et al. | 600/422 |
| 6,724,923 | B2 | * | 4/2004 | Ma et al. | 382/131 |
| 6,738,501 | B2 | * | 5/2004 | Ma et al. | 382/131 |
| 6,784,665 | B1 | * | 8/2004 | Chan et al. | 324/318 |
| 6,842,001 | B2 | * | 1/2005 | Ikezaki | 324/309 |
| 6,853,190 | B2 | * | 2/2005 | Nittka et al. | 324/309 |
| 6,930,481 | B2 | * | 8/2005 | Okamoto et al. | 324/318 |
| 6,998,843 | B2 | * | 2/2006 | Okamoto et al. | 324/318 |
| 7,049,819 | B2 | * | 5/2006 | Chan et al. | 324/319 |
| 7,084,631 | B2 | * | 8/2006 | Qu et al. | 324/318 |
| 7,150,316 | B2 | * | 12/2006 | Itskovich | 166/248 |
| 7,167,006 | B2 | * | 1/2007 | Itskovich | 324/338 |
| 2003/0094948 | A1 | * | 5/2003 | Okamoto et al. | 324/318 |
| 2004/0135579 | A1 | * | 7/2004 | Takizawa et al. | 324/309 |
| 2005/0122113 | A1 | * | 6/2005 | Okamoto et al. | 324/318 |
| 2005/0231201 | A1 | * | 10/2005 | Fujimoto et al. | 324/318 |
| 2005/0245805 | A1 | * | 11/2005 | Hoppel et al. | 600/407 |
| 2005/0264292 | A1 | * | 12/2005 | Okamoto et al. | 324/318 |

OTHER PUBLICATIONS

K. Pruessmann, M. Weiger, M. Scheidegger, P. Boesiger, *SENSE: Sensitivity encoding for fast MRI*, MRM 42:952, 1999.
M. Weiger, K. Pruessmann, C. Leussler, P. Roeschmann, P. Boesiger, *Specific coil design for Sense: a six element cardiac array*, MRM 45: 495, 2001.
N.M. Malik, E.B. Boskamp, T. Niendorf, S.A. Lindsay, J.E. Lorbiecki, D.K. Sodickson, *A 16-element coil array optimized for multi-dimensionally accelerated parallel brain imaging using multi-oblique imaging planes*, ISMRM, 13th Scientific Meeting, pp. 199, May 2005.

* cited by examiner

*Primary Examiner*—Dixomara Vargas
(74) *Attorney, Agent, or Firm*—Ziolkowski Patent Solutions Group, SC

(57) ABSTRACT

The present invention is directed to a method and apparatus of multi-directional acceleration for parallel imaging. An RF coil assembly is constructed to have a plurality of RF coils arranged in axial and tangential direction for image data acquisition with acceleration in at least two dimensions.

19 Claims, 4 Drawing Sheets

METHOD AND APPARATUS FOR MULTI-DIMENSIONAL PARALLEL MR IMAGING

BACKGROUND OF THE INVENTION

The present invention relates generally to magnetic resonance (MR) imaging and, more particularly, to a method and apparatus for multi-dimensional parallel MR imaging. The invention is further related to accelerated data acquisitions in at least two simultaneous directions. In this regard, the invention supports acceleration in the cardinal directions as well as multi-oblique imaging planes.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment Mt. A signal may be received and processed to form an image from the excited spins after the excitation signal $B_1$ is terminated.

Accelerated MR imaging techniques have been developed to expedite MR data acquisition thereby reducing scan time and increasing subject throughput. One known accelerated MR imaging technique is parallel imaging whereby a phased coil array samples an imaging volume. Generally, scan time reduction is achieved by under-sampling k-space and recording images simultaneously from multiple imaging or receive coils. Under-sampling generally reduces the data acquisition time and the use of multiple receive coils, such as a phased coil array, reduces wraparound caused by under-sampling. In this manner, scan time is reduced by increasing the distance of sampling positions in k-space. If an image space is under-sampled in the phase encoding direction, for example, by a factor of two, then it will take half the time to acquire the image. In this regard, every pixel in the image will represent data from two spatial points.

With known parallel imaging techniques, such as SENSitivity Encoding (SENSE), coil sensitivity data is reacquired. The coil sensitivity data is generally acquired in a low spatial resolution scan and is used to ascertain the sensitivity of each coil of the receive coil array to a field-of-view (FOV). Generally, the coil sensitivity data is used to weight the imaging data such that coil sensitivity is reflected in the reconstructed image, and, as a result, the coil sensitivity data reduces aliasing in the reconstructed image that can occur as a result of under-sampling. Like other parallel imaging techniques, SENSE utilizes under-sampling for accelerated data acquisition. Despite the advantages that have been achieved using known parallel imaging techniques and receive coils, scan time reduction has been limited because known receive coils are only capable of acceleration in one direction. This has been shown to be particularly problematic in brain imaging.

Parallel imaging is increasingly being used for accelerated imaging of the brain and other anatomical areas of interest. The challenges facing parallel imaging include available baseline signal-to-noise ratio (SNR), noise amplification, and acceleration factor. As described above, current coil construction supports acceleration in only one dimension. Moreover, coil designs to reduce noise have been unable to improve acceleration factors without affecting SNR. For instance, a circular array comprising sixteen coil elements distributed circumferentially has been suggested to alleviate noise amplification. However, it has been shown that electro-dynamic constraints dictate a fairly rapid degeneration in SNR at high 1D accelerations. Additionally, by placing a multitude of coil elements in the tangential direction, the individual elements distributed circumferentially get extremely narrow and long in size to cover the entire brain. Such narrow elements have been shown to become coil noise dominated, as a function of the proximity of the subject, the frequency of the coil, and the temperature of the coil.

It would therefore be desirable to have a method and apparatus for acceleration in more than one direction to further reduce scan time without sacrificing SNR.

BRIEF DESCRIPTION OF THE INVENTION

The present invention provides a method and apparatus for multi-dimensional accelerated parallel imaging that overcomes the aforementioned drawbacks.

A multi-channel RF coil array is disclosed and has a plurality of coils configured to allow for acceleration in two simultaneous dimensions during data acquisition. The coil array, while particularly applicable for brain imaging, can be extended to imaging of other anatomical regions of interest. The coil array is designed to have coil elements in both the axial and tangential directions. The coil elements in the axial direction are overlapped whereas the coil elements in the tangential direction are not. As a result of the multiple layers of coil elements in the axial direction, acceleration in the axial direction is supported.

Therefore, in accordance with one aspect of the invention, an RF coil assembly for magnetic resonance (MR) imaging includes a first set of RF coils configured to acquire accelerated MR data in one of a first direction and a second direction. The first direction is defined to be orthogonal to the second direction. The coil assembly further has a second set of RF coils configured to acquire accelerated MR data in a third direction that is orthogonal to the first and second directions.

In accordance with another aspect of the invention, an MR imaging apparatus has a plurality of gradient coils positioned about a bore of a magnet to impress a polarizing magnetic field and an RF transceiver system and an RF switch controlled by a pulse module to transmit RF signals to an RF coil assembly to acquire MR images. The RF coil has a former having a wall defining an interior volume configured to receive an object to be imaged therein and a set of RF coils attached to the former and configured to acquire accelerated MR imaging data of the object along at least two axes.

According to another aspect, the invention includes a method of parallel imaging. The method includes defining an imaging volume and acquiring MR data from the imaging volume. The MR data is acquired with simultaneous acceleration in at least two spatial directions.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

A method and apparatus are shown to acquire MR images using parallel imaging with bi-dimensional acceleration. In this manner, the net acceleration factor allows a reduction of imaging scan time in two directions. Thus, acquisition times may be reduced and subject throughput increased.

Figure 1:
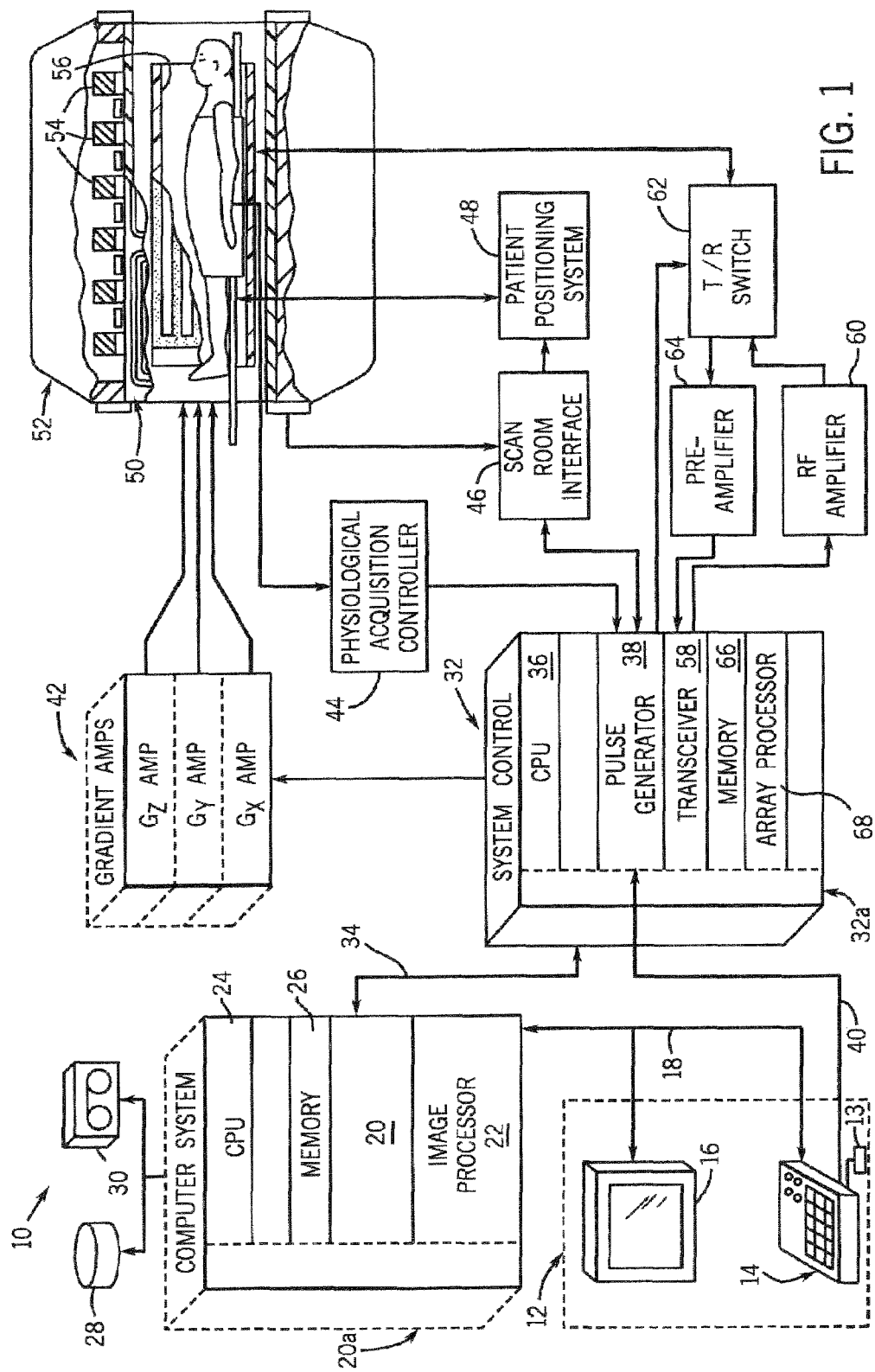
FIG. 1 is a schematic block diagram of an MR imaging system for use with the present invention.

Referring to FIG. 1, the major components of a preferred MR imaging system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

Figure 2:
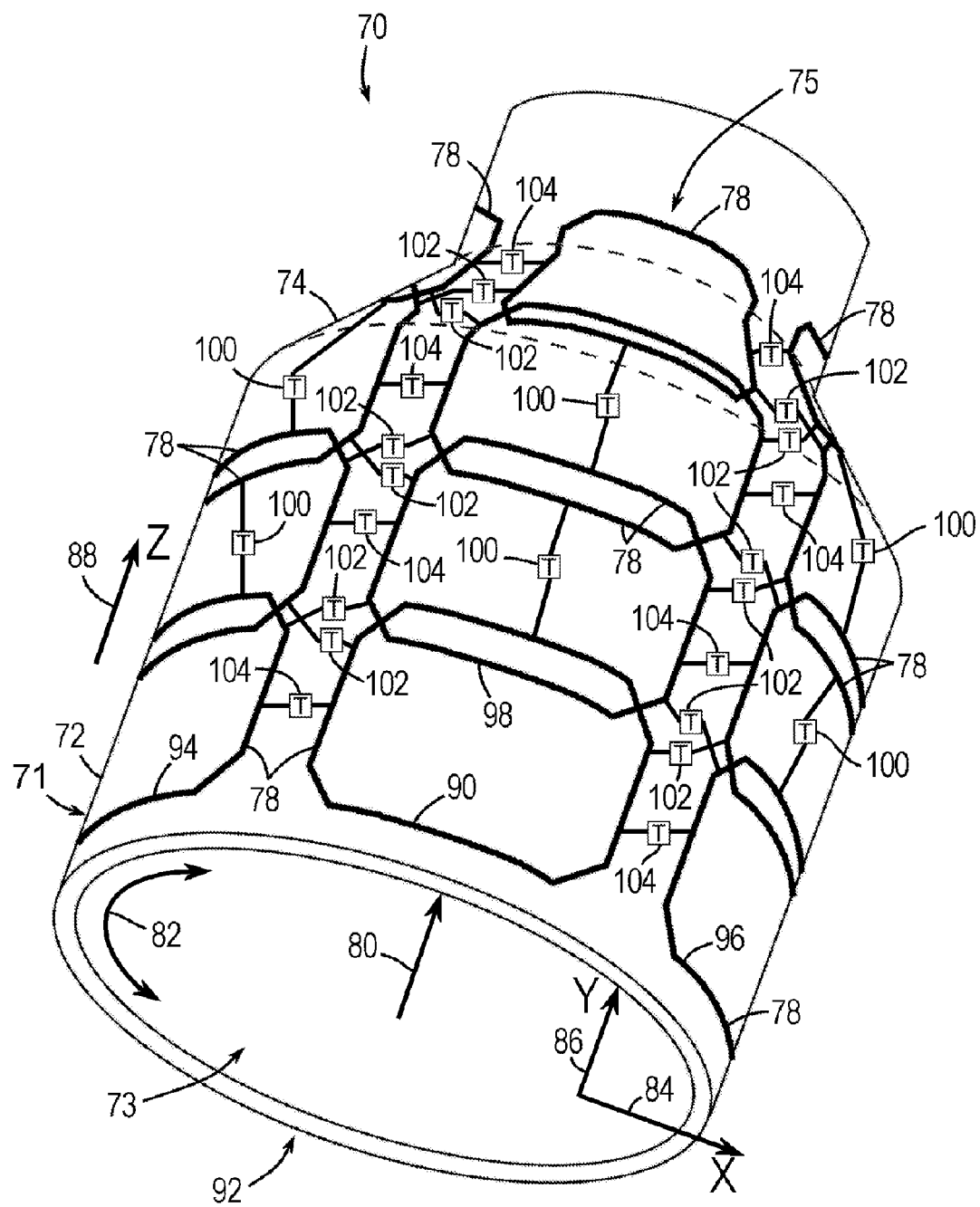
FIG. 2 is a perspective view of an RF coil assembly in accordance with the present invention.

FIG. 2 shows an RF coil assembly 70 in accordance with one embodiment of the present invention. In one preferred embodiment, RF coil assembly 70 is a head coil array having a single unitary former 71 that includes a dome section 72 for enclosing a volume 73 for receiving a head of a subject. A cone-shaped top section 74 is connected to the dome section 72 at one end thereof. In this regard, the coil assembly 70 is particularly applicable for brain imaging. It is understood, however, that the coil assembly 70 may be constructed for other anatomical studies. The coil assembly is preferably designed for 3D bi-directional parallel imaging.

RF coil assembly 70 includes an array 75 of RF coils (or coil elements) attached to former 71. In a preferred embodiment, the array 75 includes sixteen coils 78. The sixteen coils 78 are arranged such that four sets of four coils are positioned in an axial direction 80 and four coils are positioned in a tangential direction 82. In other words, the sixteen coils 78 are positioned in four columns, with four RF coils 78 in each column. The coils 78 arranged in the axial direction 80 are overlapped whereas the coils 78 in the tangential direction 82 are separated from one another. In this manner, an optimum geometry factor (g-factor) is obtained for each direction along an x direction 84, a y direction 86, and a z direction 88, which are each orthogonal to one another. However, it is also contemplated that the RF coil apparatus 70 may include a different number of RF coils 78 as long as there are multiple RF coil layers for acceleration in the desired direction 80. For example, a first pair of RF coils 90, 92 may be placed for acceleration in the y direction 86, a second pair of RF coils 94, 96 may be placed for acceleration in the x direction 84, and a third pair of RF coils 90, 98 may be placed for acceleration in the axial direction 80.

The RF coils 78 are decoupled from each other using a combination of decoupling techniques to reduce correlated noise between the coils or coil elements. Generally, a combination of coil element overlap, transformers, and low input impedance preamplifiers. That is, in a first decoupling technique, each RF coil 78 is overlapped with its adjacent neighbors in the superior/inferior (SI) direction 80 but is separated from its adjacent neighbors in the tangential direction 82. In a second decoupling technique, RF coils 78 are connected to (i) transformers 100 between next-to-nearest neighbors along the Si direction (<−15 dB), (ii) transformers 102 between diagonally positioned neighbors (<−dB), and (iii) transformers 104 between nearest neighbors in the tangential direction 82 (<−25 dB). In a third decoupling technique, each RF coil 78 is attached to a low input impedance preamplifier (not shown), e.g. 3.5 Ohm preamplifier. To prevent cable modes, a balun (not shown) is connected to the coaxial cable (not shown) connected to each RF coil 78.

As described, the coil assembly enables acceleration of data acquisition in multiple directions simultaneously. Moreover, the present invention significantly reduces scan time, but without a significant loss of SNR or image quality. In this regard, g-factor (noise amplification) maps were generated using a series of different net acceleration factors for the three cardinal planes. Due to symmetry in the coil design, the g-factor maps for the sagittal plane are identical to those derived from the coronal plane. Axial slices were acquired for different locations relative to the SI center of the coil assembly without any noticeable difference in the g-factor maps. The average values of the g-factor are close to one for both the sagittal and axial planes as summarized in Table 1, whereby the acceleration factor, R, along both the phase and the frequency encoding direction equals 2, 2.67, and 3, respectively, leading to a total acceleration factor of 4, 7.13, and 9, respectively.

TABLE 1

| | Sagittal Plane | | | | Axial Plane | |
|---|---|---|---|---|---|---|
| R | Mean (SI) | Maximum (SI) | Mean (AP/RL) | Maximum (AP/RL) | Mean (AP/RL) | Maximum (AP/RL) |
| 2 | 1.02 | 1.08 | 1.00 | 1.04 | 1.03 | 2.40 |
| 2.67 | 1.07 | 1.51 | 1.07 | 1.58 | 1.20 | 5.68 |
| 3 | 1.13 | 1.89 | 1.16 | 1.88 | 1.35 | 7.28 |

The reduction in the g-factor resulted in an SNR enhancement for higher acceleration factors, which facilitated further scan time reductions without compromising spatial resolution. With a net acceleration factor of nine, a relatively impractical 11:00 minutes acquisition time was reduced to 1:13 minutes without a significant degradation of spatial resolution.

Figure 3:
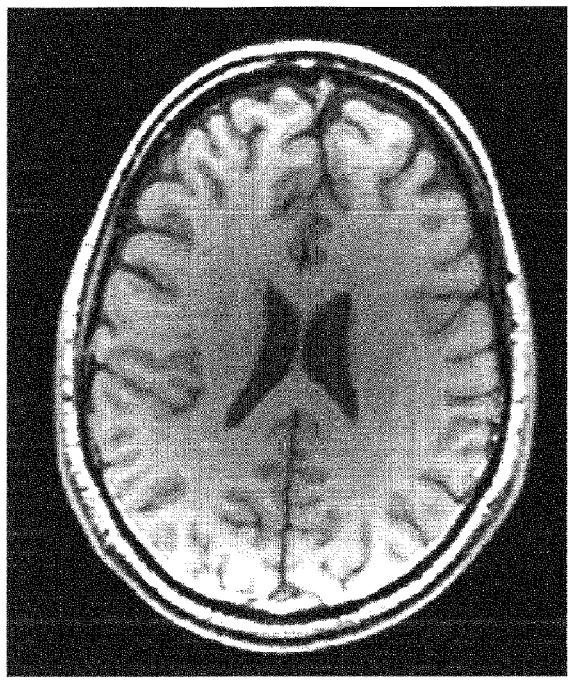
FIG. 3 is a reconstructed image acquired with the RF coil assembly of FIG. 2 without acceleration.
Figure 4:
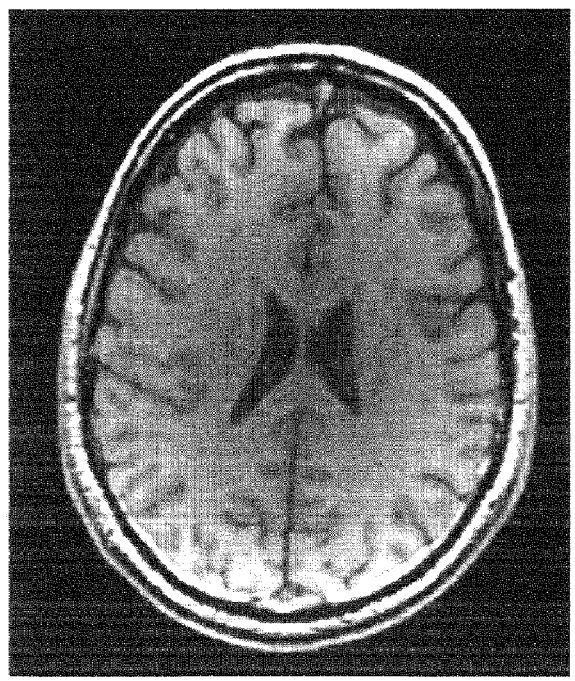
FIG. 4 is a reconstructed image acquired with the RF coil assembly of FIG. 2 with a bi-directional acceleration factor of two.
Figure 5:
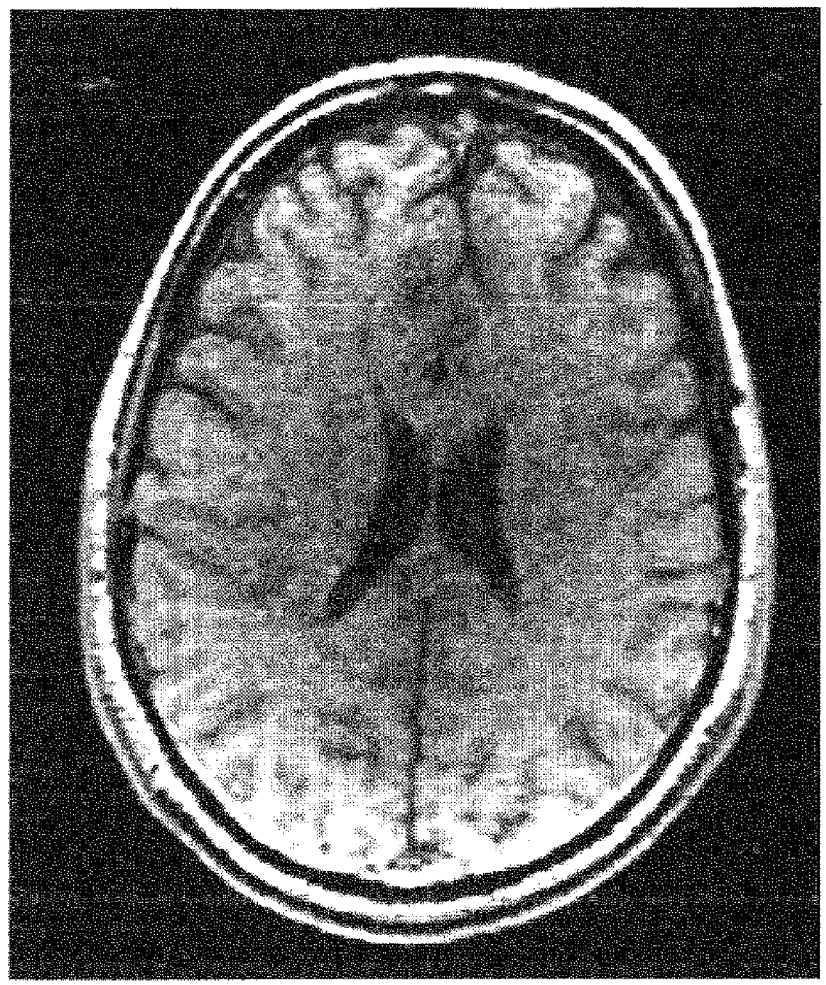
FIG. 5 is a reconstructed image acquired with the RF coil assembly of FIG. 2 with a bi-directional acceleration factor of three.

Referring now to FIGS. 3-5, images reconstructed from data acquired from the coil assembly of FIG. 2 are shown illustrating the advantages of the present invention. The MR data from which the images of FIGS. 3-5 were reconstructed was acquired with a $T_1$ weighted 3D spoiled gradient echo imaging sequence using 1.0 mm isotropic spatial resolution. A generalized encoding matrix algorithm was applied for reconstructing the accelerated images. For comparison, each of the images is an axial brain image. For the data imaged in FIG. 3, no acceleration (R=1) was used resulting in a scan time of 11:00 minutes. For the data imaged in FIG. 4, a bi-dimensional acceleration of R=2×2 was used resulting in a scan time of 2:45 minutes. For the data imaged in FIG. 5, a bi-dimensional acceleration of R=3×3 was used resulting in a scan time of 1:13 minutes. As such, a reduction factor of nine yielded a nine-fold decrease in scan time without significant loss in image quality or SNR. This reduces subject time in the scanner and thus improves subject comfort, and can be helpful for MR scans that require subject breath-holding. Further, it is contemplated that the present invention will be particularly useful for 3D angiography. The above reduction factor are merely exemplary and, as such, it is contemplated that reduction factors different from those enumerated above are possible and considered within the scope of the invention.

A multi-element RF coil assembly as described herein affords simultaneous accelerations not only along all three main directions but for multi-oblique imaging planes as well. Noise amplification maps reveal g-factors close to one for all three cardinal imaging planes. Accelerated images confirm the SNR advantage of bi-dimensional accelerations using the coil constructed disclosed herein.

Therefore, an RF coil assembly for magnetic resonance (MR) imaging is disclosed and includes a first set of RF coils configured to acquire accelerated MR data in one of a first direction and a second direction. The first direction is defined to be orthogonal to the second direction. The coil assembly further has a second set of RF coils configured to acquire accelerated MR data in a third direction that is orthogonal to the first and second directions.

An MR imaging apparatus is also disclosed and has a plurality of gradient coils positioned about a bore of a magnet to impress a polarizing magnetic field and an RF transceiver system and an RF switch controlled by a pulse module to transmit RF signals to an RF coil assembly to acquire MR images. The RF coil has a former having a wall defining an interior volume configured to receive an object to be imaged therein and a set of RF coils attached to the former and configured to acquire accelerated MR imaging data of the object along at least two axes.

The invention further includes a method of parallel imaging. The method includes defining an imaging volume and acquiring MR data from the imaging volume. The MR data is acquired with simultaneous acceleration in at least two spatial directions.

The present invention has been described in terms of the preferred embodiment, and it is recognized that equivalents, alternatives, and modifications, aside from those expressly stated, are possible and within the scope of the appending claims.

What is claimed is:

1. An RF coil assembly comprising:
   a first set of RF coils configured to acquire accelerated MR data in a first direction and a second direction, wherein the first direction is orthogonal to the second direction;
   a second set of RF coils configured to acquire accelerated MR data in a third direction that is orthogonal to the first and second directions; and
   a single unitary former configured to support thereon the first set of RF coils and the second sets of RF coils.

2. The coil assembly of claim 1 wherein the second set of RF coils includes at least one coil of the first set of RF coils.

3. The coil assembly of claim 1 wherein the first set of RF coils comprises four sub-sets of opposing coil pairs.

4. The coil assembly of claim 3 wherein a portion of each sub-set of opposing coil pairs of the first set of RF coils overlaps a portion of at least another sub-set of opposing coil pairs of the first set of RF coils.

5. The coil assembly of claim 3 wherein the second set of RF coils comprises four sub-sets of opposing coil pairs.

6. The coil assembly of claim 5 wherein a portion of each sub-set of opposing coil pairs of the second set of RF coils overlaps a portion of at least another sub-set of opposing coil pairs of the second set of RF coils.

7. The coil assembly of claim 1 wherein the coils of the first set of RF coils do not overlap the coils of the second set of RF coils.

8. The coil assembly of claim 1 wherein each coil of the first and second sets of RF coils has a plurality of transformers connected thereto configured to decouple each coil from other coils.

9. The coil assembly of claim 1 wherein the single unitary former supports the first and second sets of RF coils circumferentially around a subject to be imaged when the subject is positioned within an imaging volume of the single unitary former.

10. An MR imaging apparatus comprising:
a plurality of gradient coils positioned about a bore of a magnet to impress a polarizing magnetic field and an RF transceiver system and an RF switch controlled by a pulse module to transmit RF signals to an RF coil assembly configured to acquire MR images, the RF coil comprising:
a former having a wall defining an interior volume configured to receive an object to be imaged therein; and
a set of RF coils attached to the wall of the former circumferentially around the interior volume and configured to acquire accelerated MR imaging data of the object along each of three orthogonal axes.

11. The MR apparatus of claim 10 wherein the set of RF coils includes sixteen RF coils positioned in four subsets having four of the RF coils in each subset.

12. The MR apparatus of claim 11 wherein the RF coils in each subset do not overlap the RF coils in adjacent subsets.

13. The MR apparatus of claim 11 wherein each RF coil in one subset overlaps at least one adjacent RF coil in the one subset.

14. The MR apparatus of claim 10 wherein the set of RF coils is further configured to acquire, in parallel, accelerated MR imaging data along a multi-oblique imaging plane.

15. A method of parallel imaging comprising the steps of:
defining an imaging volume;
acquiring MR data by sampling the imaging volume with simultaneous acceleration with a phased coil array configured to acquire accelerated MR imaging data of an object along each of three orthogonal axes and attached to a single unitary former; and
reconstructing an image from the MR data.

16. The method of claim 15 wherein the three orthogonal axes includes a multi-oblique imaging plane.

17. The method of claim 15 further comprising the step of determining coil sensitivity to the imaging volume for each coil of the phased coil array.

18. The method of claim 17 further comprising the step of weighting the MR data based on coil sensitivity of each coil, respectively.

19. The method of claim 18 further comprising the step of reconstructing an image from the weighted MR data.

* * * * *